United States Patent [19]
Park

[11] Patent Number: 5,748,555
[45] Date of Patent: May 5, 1998

[54] MEMORY ADDRESS PREVIEW CONTROL CIRCUIT

[75] Inventor: Soung Hwi Park, Pusan-si, Rep. of Korea

[73] Assignee: LG Semicon Co., Ltd., Chungcheongbuk-do, Rep. of Korea

[21] Appl. No.: 703,772

[22] Filed: Aug. 27, 1996

[30] Foreign Application Priority Data

Dec. 27, 1995 [KR] Rep. of Korea ............... 58892/1995

[51] Int. Cl.⁶ ........................................... G11C 8/00
[52] U.S. Cl. ............................. 365/230.04; 365/239
[58] Field of Search ..................... 365/203.04, 239

[56] References Cited

U.S. PATENT DOCUMENTS

| | | | |
|---|---|---|---|
| 3,846,765 | 11/1974 | De Vries | 365/230.04 |
| 4,247,920 | 1/1981 | Springer et al. | 365/230.04 |
| 5,247,644 | 9/1993 | Johnson et al. | 365/230.04 |
| 5,261,064 | 11/1993 | Wyland | 365/230.04 |
| 5,453,957 | 9/1995 | Norris et al. | 365/230.04 |
| 5,497,355 | 3/1996 | Mills et al. | 365/230.04 |

*Primary Examiner*—David C. Nelms
*Assistant Examiner*—Trong Phan

[57] ABSTRACT

A memory, and associated method of operating the memory, for use with a computer, the memory receiving address information from the computer via an address bus. The memory includes: an odd-address block of memory cells; an even-address block of memory cells; and an enablement circuit for simultaneously enabling either the odd-address block or the even-address block to be read from or written into and enabling a non-data exchange operation, i.e., a memory location access, in the other memory cell block that takes place while the other memory cell block is disabled to read or write. The simultaneous operations in the odd-address block and in the even-address block take place at the same location (in some instances) and at different locations (in other instances) so that, in the circumstance where the computer directs operations to take place upon sequential memory locations, the data at the second address is pre-accessed and available as soon as the address changes from the first address to the second address, which reduces overall memory access time.

25 Claims, 3 Drawing Sheets

MEMORY ADDRESS PREVIEW CONTROL CIRCUIT

BACKGROUND OF THE INVENTION

The present invention relates to a memory address control circuit, and more particularly, to a circuit which is designed to reduce the access time of a memory, especially when an address increases sequentially.

A memory address control circuit of prior art is described herein with reference to the attached drawings.

FIG. 1 is a diagram showing a prior art memory access circuit operable in an interleave mode for high-speed memory access. The memory address control circuit of FIG. 1 includes a memory which has N-bit addresses from $A_0$ to $A_{N-1}$, and an m-bit data bus, formed from the memory cell blocks 12–15 each of which is $2^{N-2}$ addresses in capacity.

Addresses $A_2$–$A_{N-1}$ are input in parallel to each of the memory cell blocks 12–15 over an (N-4) bit address bus. Each memory cell block has an m-bit data input/output terminal for interfacing with the m-bit data bus.

A read/write signal and other controlling signals are simultaneously connected to each of the above four memory cell blocks 12, 13, 14, and 15. Addresses $A_0$ and $A_1$ are input to an address decoder 11 to thereby select only one among the memory cell blocks 12, 13, 14, and 15.

Operation of the prior art memory address control circuit of FIG. 1 will be described below. As shown in FIG. 1, when addresses $A_0$–$A_{N-1}$ are input, the same addresses within each of the four memory cell blocks 12, 13, 14, and 15 are simultaneously selected, using addresses $A_2$–$A_{N-1}$. Address decoder 11 operates only one memory cell block among the four memory cell blocks 12, 13, 14, and 15 using addresses $A_0$–$A_1$, to thereby enable data to be read or written.

In FIG. 1, when addresses $A_0$–$A_{N-1}$ change, the selected memory cell block accesses the address on lines $A_2$–$A_{N-1}$. This requires a memory address access time.

If, however, only addresses $A_0$–$A_1$ change, without addresses $A_2$–$A_{N-1}$ changing, the address of each of the memory cell blocks 12, 13, 14, and 15 has been already accessed. Therefore, in this state, it will require little time to access an address within a memory cell block because the problem is only to select which of the memory cell blocks 12–15 is to be operated/enabled.

The time to operate the address decoder 11 and thereby select one of the memory cell blocks 12–15 is much faster than a memory address access time. Thus, the memory access time of the whole circuit becomes very short in case where only addresses $A_0$ and $A_1$ change. Furthermore, if addresses $A_2$–$A_{N-1}$ change, a memory address access time is required.

When the address of the memory circuit is accessed sequentially, a memory address access time will be required if the bit pattern $A_2$–$A_{N-1}$ changes. In the case where addresses $A_0$ and $A_1$ increase or decrease sequentially, the bit pattern $A_2$–$A_{n-1}$ will change with every fourth change of $A_O$ and $A_1$. This requires a memory address access time, thereby deteriorating total efficiency due to a speed difference between the memory and a central processing unit (CPU).

SUMMARY OF THE INVENTION

Accordingly, there is provided a memory address control circuit of the present invention to solve the problems of the prior art as stated above. It is a main object of the present invention to provide a memory address control circuit for reducing the memory access time when an address increases or decreases sequentially in a memory access circuit, thereby preventing an efficiency drop caused by the speed difference between the memory and CPU, and also for improving the operating efficiency of the whole circuit.

To achieve the main object of the present invention, there is provided a memory address control circuit wherein second through Nth input address signals are input into even and odd-address memory cell blocks through an address converting apparatus, a first address input signal is applied as first, second and third control signals to the address converting apparatus, and the even and odd-address memory cell blocks through an inverter, and an m-bit data bus, a read/write control signal, and other controlling signals are simultaneously applied to input/output terminals of the even and odd-address memory cell blocks.

The objects of the present invention are fulfilled by providing a method of controlling a memory for use with a computer, the memory receiving address information from the computer via an address bus and being divided into a first block of memory cells and a second block of memory cells. This method comprises the step of: simultaneously enabling a data exchange operation by one of a first and second memory cell block and enabling a non-data-exchange operation by the other memory cell block, based upon a single address on the address bus.

The objects of the present invention also are fulfilled by providing a memory for use with a computer, the memory receiving address information from the computer via an address bus. This memory comprises: a first block of memory cells; a second block of memory cells; and enablement means, operatively connected to the address bus, for simultaneously enabling a data exchange operation by one of the first and second memory cell blocks and enabling a non-data-exchange operation by the other memory cell block, based upon a single address on the address bus.

The foregoing and other objectives of the present invention will become more apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

A preferred embodiment of the memory address control circuit of the present invention will be described herein with reference to the attached drawings.

Figure 1:
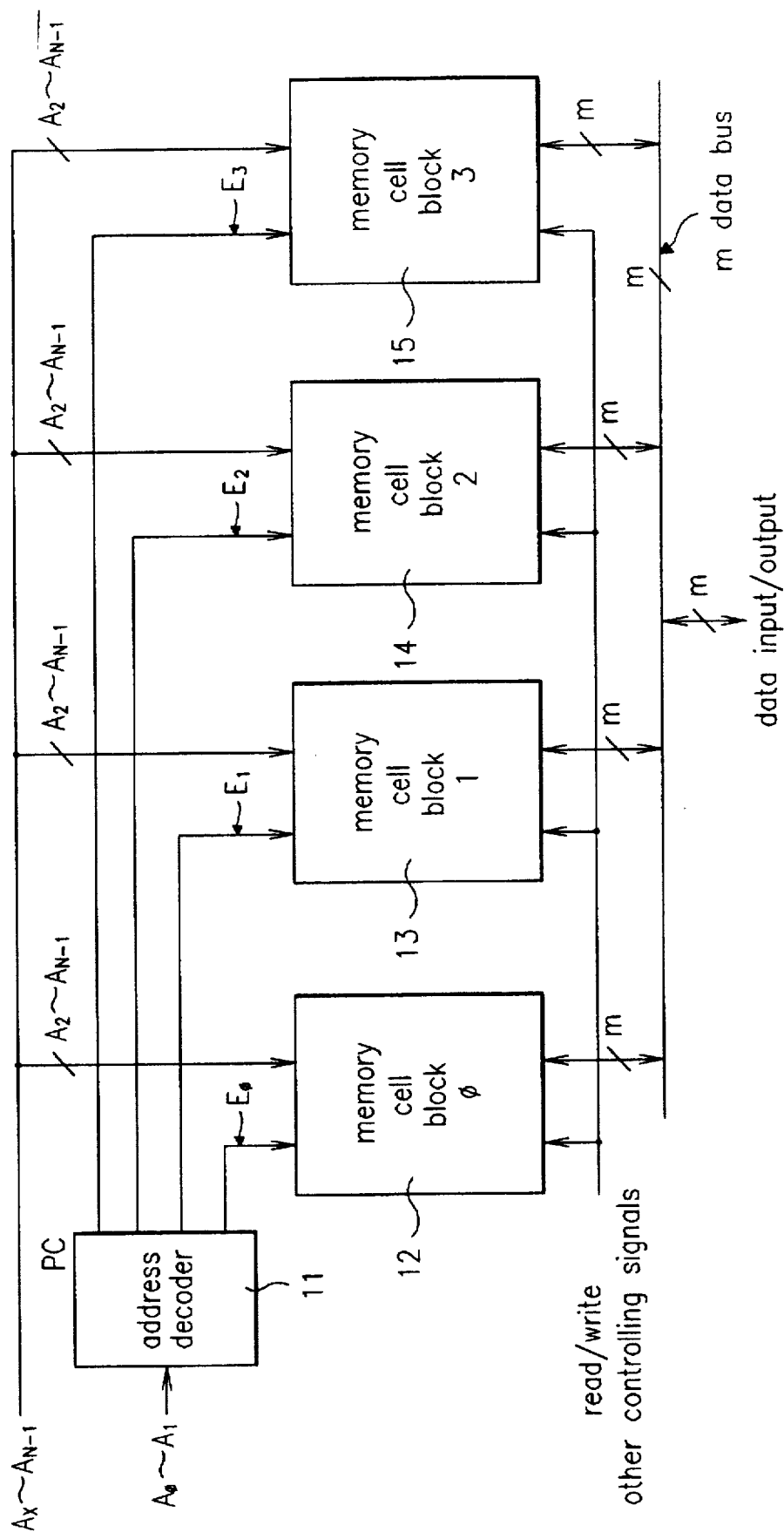
FIG. 1 is a diagram showing a memory access circuit of prior art.
Figure 2:
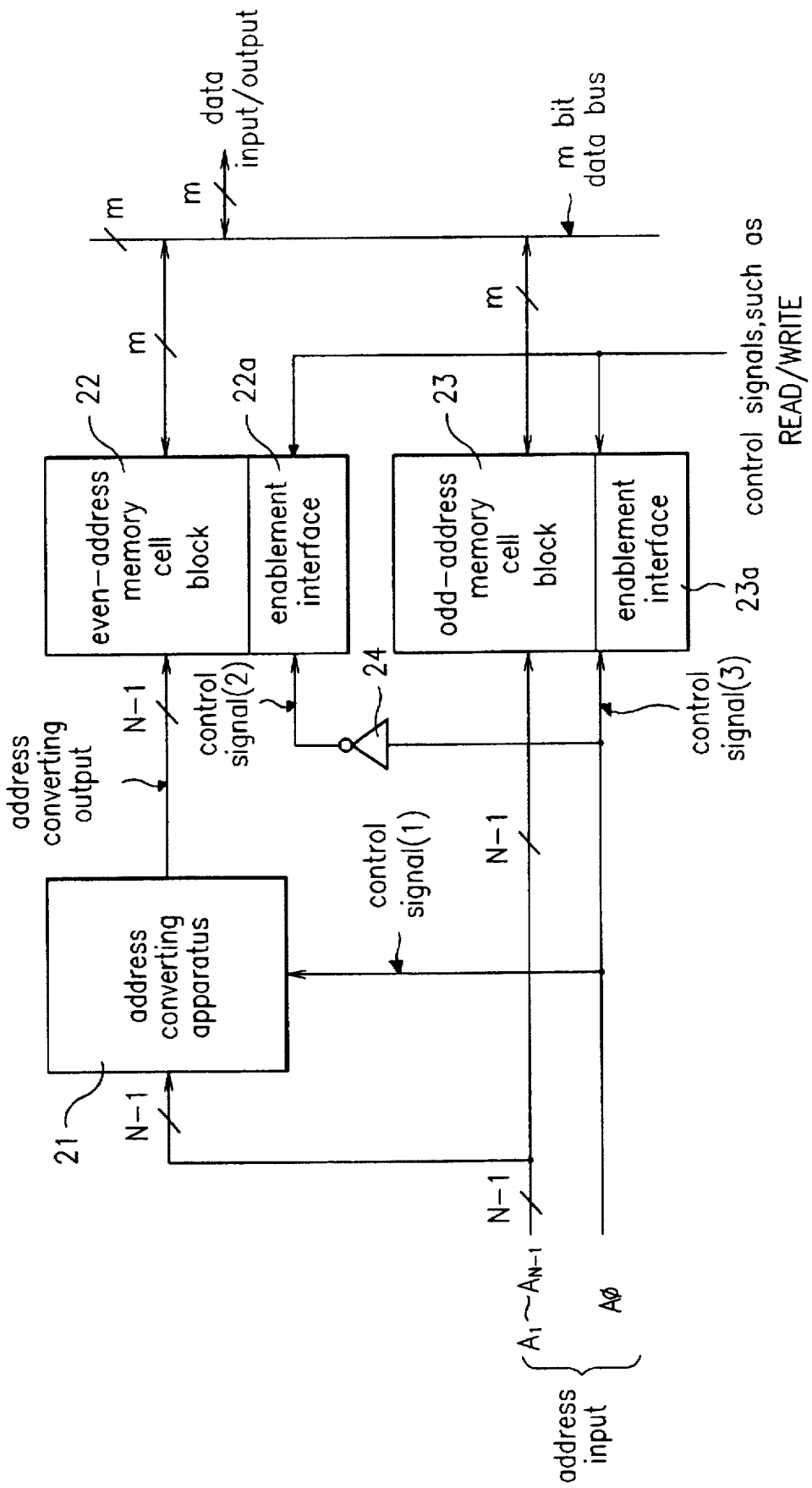
FIG. 2 is a diagram showing a memory address control circuit of the present invention.
Figure 3:
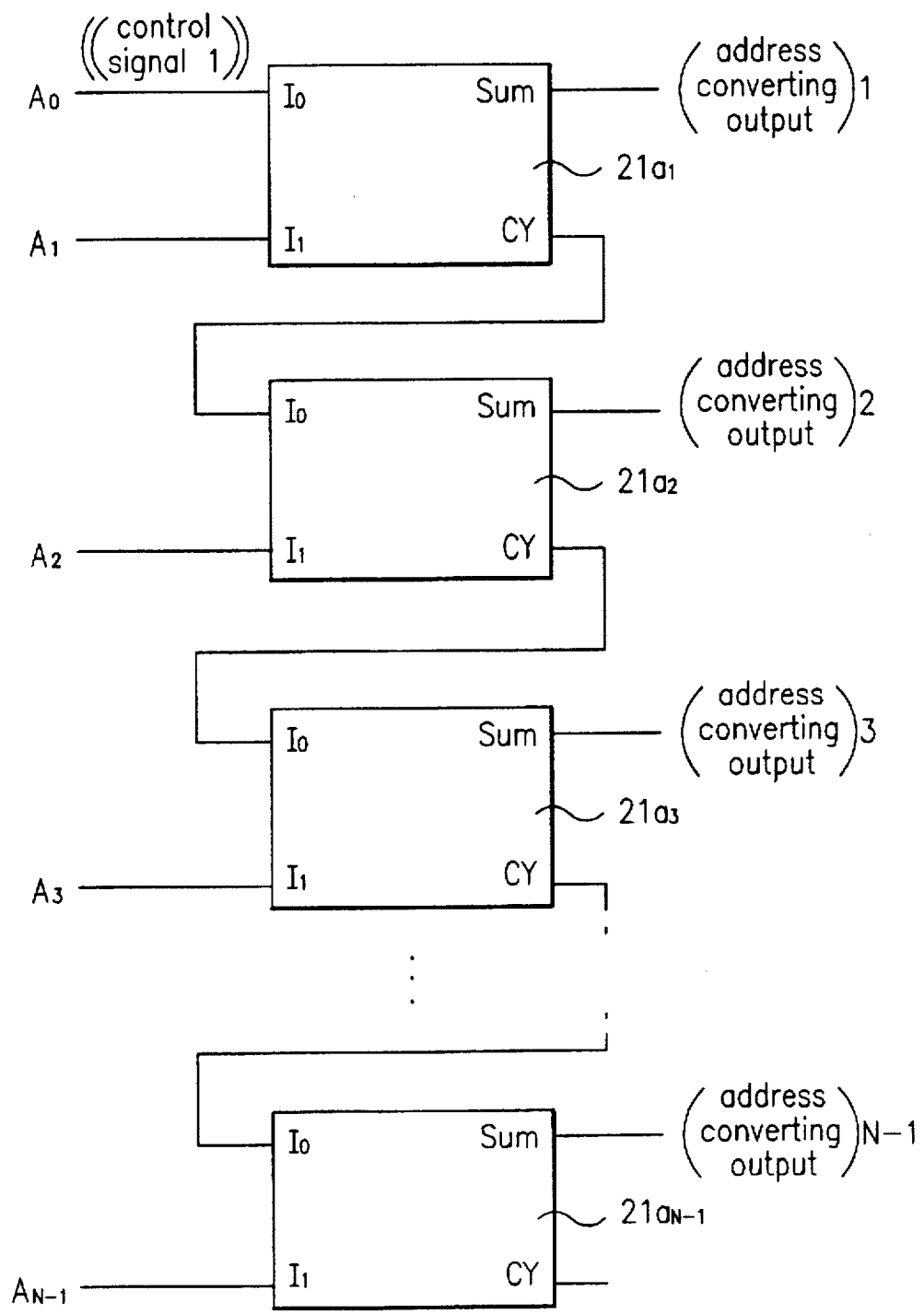
FIG. 3 is a diagram showing an address converting apparatus for the memory address control circuit of the present invention.

FIG. 2 is a block diagram of a memory address control circuit of the present invention, and FIG. 3 is a diagram showing an address converting apparatus for the memory address control circuit of the present invention.

In the memory address control circuit of the present invention, as shown in FIG. 2, a memory cell is divided into an even-address memory cell block 22 and an odd-address memory cell block 23. The input/output terminals of the even and odd memory cell blocks 22 and 23 are connected with an m-bit data bus, corresponding to the data input/output terminals of the whole memory circuit. The odd-address memory cell block 23 and the address converting apparatus 21 are each connected to the address bus over which N-bit addresses, $A_O A_1 A_2 \ldots A_{N-1}$, are provided.

Common control signals, that is, a read/write control signal and other control signals are simultaneously coupled to two memory cell blocks 22 and 23, and the operation of the respective memory cell blocks 22 and 23 is controlled by the lowest input address $A_0$.

The first portion of address input signal, e.g., $A_{O_j}$ is also referred to as control signals 1 and 3 for the address converting apparatus 21 and for the odd-address memory cell block 23, respectively. The signal $A_O$, inverted through an inverter 24, becomes a control signal 2 of the even-address memory cell block 22.

The control signals 2 and 3 enable the operation of the even-address memory cell block 22 and the odd-address memory cell block 23 via the enablement interfaces 22a and 23a, respectively. If signal $A_0$ is "1", then the address being input designates an odd address. The control signal 2 then becomes "0" (because of the inverter 24) and the enablement interface 22a disables the even-address memory cell block 22 so that it is possible to read or write data only in the odd-address memory cell block 23. If signal $A_0$ is "0", then the address being input designates an even address. The enablement interface 23a disables the odd-address memory cell block 23. The control signal 2 then is "1" (because of the inverter 24) and the enablement interface 22a enables the even-address memory cell block 22 so that it is possible to read or write data in the even-address memory cell block 22.

The second portion of the address, e.g., signals $A_1-A_{N-1}$, is directly connected to the address input terminal of the odd-address memory cell block 23, and to the address input terminal of the even-address memory cell block 22 via the address converting apparatus 21.

The address converting apparatus 21 is constructed so that, as shown in FIG. 3, a predetermined number of half adders $21_{a1!}-21_{aN-1}$ are serially connected with each other. The address signal $A_1-A_{N-1}$ is applied to the set of half adders such that signal $A_1$ is applied to the $I_1$ input of the half adder $21a_1$, the signal $A_2$ is applied to the half adder $21a_2$, ... and the signal $A_{N-1}$ is applied to the half adder $21a_{N-1}$. The effect is that $A_0$ is added to the value represented by the bit pattern $A_1-A_{N-1}$.

If the address input signal $A_0$ is "0", then address input signals $A_1-A_{N-1}$ become the address converting outputs of the half adders $21_{a1-21aN-1}$ without any change. If signal $A_0$ is "1", then the address converting outputs become the sum of the address input signals $A_1-A_{N-1}$ added with a "1". In other words, the intra-cell address of the even-address memory cell block 22 becomes different than the intra-cell address of the odd-address memory cell block 23; here, it is greater by one.

The operation of a memory address control circuit of the present invention composed as above will be described in detail below.

The main operation of the memory address control circuit of the present invention improves its whole operation speed because an address immediately following the currently accessed address is always pre-accessed. Usually, a program sequentially accesses contiguous memory addresses, e.g., a second address differing from a first address by "1". Discontiguous memory accessing does not occur often. Therefore, while a certain address currently is being accessed, if the immediately following address is accessed in advance (or "pre-accessed"), the accessing time of the next address is much reduced. Such a pre-accessing operation sharply reduces the whole access time for continuous memory accesses.

For example, when memory data of an address $A_2A_1O_0=$ "100" is desired, address "100" of the even-address memory cell block 22 and address "101" of the odd-address memory cell block 23 are simultaneously accessed. The location in the memory cell block 22 or 23 is determined by the bits $A_2A_1=$"10". To reiterate, the bit $A_0$ is used, in part, to select one of the memory cell blocks 22 and 23. Here, because the lowest bit $A_O$ of input address "100" is "0", the even-address memory cell block 22 is enabled to allow data input/output, whereas the odd-address memory cell block 23 is disabled so that it is impossible to perform data input/output. In this state, however, the cell in the odd-address memory cell block 23, corresponding to the address $A_2A_1=$"10" is accessed already.

When the input address increases to "101", the signal $A_O$ changes to "1". Now, the even-address memory cell block 22 is disabled so that it is impossible to perform data input/output. The odd-address memory cell block 23, however, is enabled to allow an immediate data input/output of the previously accessed address "101", i.e., $A_2A_1=$"10". Here also, the address converting apparatus 21 converts $A_2A_1A_0=$ "110" (=101+1) which causes the even-address memory cell block 22 to pre-access the address "110". Again, the address "110" immediately follows the address "101" being accessed simultaneously by the odd-address memory cell block 22. When $A_0$ changes from "1" to "0", i.e., when $A_2A_1A_0$ increments from "101" to "110", the even-address memory cell block 23 will have already accessed the location $A_2A_1=$"10". By anticipating the contiguously sequential nature of memory accesses, the memory address control circuit can achieve very speedy access times as a whole.

The operation of the half adders $21_{a1}-21_{aN-1}$, i.e., as reflected in the outputs "CY" and "Sum", may be shown by the following logic expression:

$CY=I_0 \cdot I_1=I_0.\text{AND}. I_1$ $\text{Sum}=I_0 \oplus I_1=I_0.\text{EXCLUSIVE-OR}. I_1$ As described above, the memory address control circuit of the present invention accesses the immediately following address in advance, while the immediately preceding address is accessed currently, thereby greatly reducing the memory-access time (or memory latency). This prevents an efficiency drop caused by the speed difference between a memory and CPU, and accordingly improves the total operation efficiency of the memory circuit.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A memory for use with a computer, the memory receiving address information from the computer via an address bus, the memory comprising:

a first block of memory cells;

a second block of memory cells;

enablement means, operatively connected to the address bus, for simultaneously enabling a data exchange operation by one of the first and second memory cell blocks and enabling a non-data-exchange operation by the other memory cell block, based upon a single address on the address bus;

wherein a first portion of the address identifies one of the memory cell blocks and a second portion identifies a location within a memory cell block;

wherein the enablement means also is for simultaneously enabling the memory cell block identified by the first portion of the address for the data exchange operation and for enabling the other memory cell block for the non-data-exchange operation;

wherein the first memory cell block is an odd-address memory cell block;

wherein the second memory cell is an even-address memory cell block; and wherein the first portion of the address identifies the address as either an odd address or an even address;

wherein each of the odd-address and the even-address memory cell blocks includes:

disable means, operatively connected to receive a disable signal, for disabling the memory cell block when the disable signal received thereby assumes a predetermined state;

wherein the enablement means includes:

address converter means, operatively connected between the data bus and the even-address memory cell, for converting an odd address to an immediately following even address and for passing an even-address unaltered;

and an inverter inverting the first part of the address;

wherein the disable means of the odd-address memory cell block receives the first portion of the address as the disable signal; and wherein the inverter is operatively connected between the address bus and the even-address memory block to invert the first part of the address, the disable means of the even-address memory block receiving the inverted first part of the address as the disable signal.

2. A memory as in claim 1, wherein:

the address converter means includes a plurality of cascade connected half-adders; and wherein the plurality of half adders adds the first portion of the address to the second portion of the address.

3. A memory as in claim 1, wherein:

the address is an N-bit word, $A_0 A_1 0 \ldots A_{N-1}$;

wherein the first portion of the address is $A_0$; and wherein the second portion of the address is $A_1 \ldots A_{N-1}$.

4. A memory for use with a computer, the memory receiving address information from the computer via an address bus, the memory comprising:

a first block of memory cells;

a second block of memory cells;

enablement means, operatively connected to the address bus, for simultaneously enabling a data exchange operation by one of the first and second memory cell blocks and enabling a non-data-exchange operation by the other memory cell block, based upon a single address on the address bus;

wherein the data exchange operation by one of the first and second memory cell blocks takes place at a first location and the non-data-exchange operation by the other memory cell block takes place at a second location different than the first location; and wherein an intra-cell address of the second location differs from an intra-cell address of the first location by one.

5. A method as in claim 4, wherein:

the intra-cell address of the second location is greater than the intra-cell address of the first location by one.

6. A memory for use with a computer, the memory receiving address information from the computer via an address bus, the memory comprising:

a first block of memory cells;

a second block of memory cells;

address converter means, operatively connected to the address bus, for performing an arithmetic operation upon an address on the address bus;

enablement means, operatively connected to the address bus, for simultaneously enabling a data exchange operation by one of the first and second memory cell blocks and enabling a non-data-exchange operation by the other memory cell block, based upon the address and a result from the address converter means, respectively.

7. A memory as in claim 6, wherein:

the data exchange operation is either a read or write operation; and wherein the non-data-exchange operation is a memory location access taking place while the memory cell block is disabled to read or write.

8. A memory as in claim 7, wherein:

the data exchange operation is a read operation.

9. A memory as in claim 6, wherein:

a first portion of the address identifies one of the memory cell blocks and a second portion identifies a location within a memory cell block;

wherein the enablement means also is for simultaneously enabling the memory cell block identified by the first portion of the address for the data exchange operation and for enabling the other memory cell block for the non-data-exchange operation.

10. A memory as in claim 9, wherein:

the first memory cell block is an odd-address memory cell block;

the second memory cell is an even-address memory cell block; and the first portion of the address identifies the address as either an odd address or an even address.

11. A memory as in claim 6, wherein:

the data exchange operation by one of the first and second memory cell blocks takes place at a first location and the non-data-exchange operation by the other memory cell block takes place at a second location different than the first location.

12. A memory as in claim 6, wherein the address converter means is operable to add a first portion of the address to the address to produce a new address.

13. A memory as in claim 6, wherein the address converter means is operable to perform the arithmetic operation by implementing the logical equations: $I_0$. AND. $I_1$; and $I_0$. EXCLUSIVE-OR. $I_1$.

14. A method of controlling a memory for use with a computer, the memory receiving address information from the computer via an address bus and being divided into a first block of memory cells and a second block of memory cells, the method comprising the steps of:

identifying one of the memory cell blocks according to a first portion of the address;

identifying a location within a memory cell block according to a second portion of the address;

simultaneously enabling a data exchange operation by one of a first and second memory cell block and enabling a non-data-exchange operation by the other memory cell block, based upon a single address on the address bus;

the step of simultaneously enabling including enabling the memory cell block identified according to the first portion of the address for the data exchange operation and enabling the other memory cell block for the non-data-exchange operation;

wherein the first memory cell block is an odd-address memory cell block;

wherein the second memory cell is an even-address memory cell block;

wherein the step of identifying one of the memory cell blocks identifies the address as either odd or even as a function of the first portion of the address; and wherein the step of simultaneously enabling further includes:

disabling a memory cell block when a disable signal therefor thereby assumes a predetermined state;

providing the first part of the address as a disable signal to the odd-address memory cell block;

providing an address unaltered from the address bus to the odd-address memory cell block;

providing an address to the even-address memory cell block by one of converting an odd address to an immediately following even address and passing an even address unaltered;

inverting the first part of the address; and providing the inverted first part of the address as a disable signal to the even-address memory cell block.

15. A method as in claim 14, wherein:

the step of providing an address to the even-address memory cell block converts by adding the first portion of the address to the second portion of the address.

16. A method as in claim 14, wherein:

the address is an N-bit word, $A_0 A_1 \ldots A_{N-1}$;

wherein the first portion of the address is $A_0$; and wherein the second portion of the address is $A_1 \ldots A_{N-1}$.

17. A method of controlling a memory for use with a computer, the memory receiving address information from the computer via an address bus and being divided into a first block of memory cells and a second block of memory cells, the method comprising the step of:

simultaneously enabling a data exchange operation by one of a first and second memory cell block and enabling a non-data-exchange operation by the other memory cell block, based upon a single address on the address bus;

wherein the step of simultaneously enabling enables the data exchange operation by one of the first and second memory cell blocks at a first location and enables the non-data-exchange operation by the other memory cell block at a second location different than the first location; and wherein an intra-cell address of the second location differs from an intra-cell address of the first location by one.

18. A method as in claim 17, wherein:

the intra-cell address of the second location is greater than the intra-cell address of the first location by one.

19. A method of controlling a memory for use with a computer, the memory receiving address information from the computer via an address bus and being divided into a first block of memory cells and a second block of memory cells, the method comprising the step of:

performing an arithmetic operation upon an address on the address bus;

simultaneously enabling a data exchange operation by one of a first and second memory cell block and enabling a non-data-exchange operation by the other memory cell block, based upon the address and a result of the arithmetic operation, respectively.

20. A method as in claim 19, wherein:

the data exchange operation is either a read or write operation; and wherein the non-data-exchange operation is a memory location access taking place while the memory cell block is disabled to read or write.

21. A method as in claim 20, wherein:

the data exchange operation is a read operation.

22. A method as in claim 19, further comprising:

identifying one of the memory cell blocks according to a first portion of the address;

identifying a location within a memory cell block according to a second portion of the address;

the step of simultaneously enabling enables the memory cell block identified according to the first portion of the address for the data exchange operation and enables the other memory cell block for the non-data-exchange operation.

23. A method as in claim 2, wherein:

the first memory cell block is an odd-address memory cell block;

the second memory cell is an even-address memory cell block; and the step of identifying one of the memory cell blocks identifies the address as either odd or even as a function of the first portion of the address.

24. A method as in claim 19, wherein:

the step of simultaneously enabling enables the data exchange operation by one of the first and second memory cell blocks at a first location and enables the non-data-exchange operation by the other memory cell block at a second location different than the first location.

25. A method as in claim 19, wherein the step of performing an arithmetic operation includes adding a first portion of the address to the address to produce a new address.

* * * * *